United States Patent [19]
Canova

[11] Patent Number: 5,523,919
[45] Date of Patent: Jun. 4, 1996

[54] LAMINAR BOARD FOR THE PRODUCTION OF PRINTED CIRCUITS, PRINTED CIRCUIT MADE WITH THE SAID BOARD, AND METHOD FOR ITS FABRICATION

[75] Inventor: Antonio Canova, Montevarchi, Italy

[73] Assignee: Magnetek S.p.A., Siena, Italy

[21] Appl. No.: 371,009

[22] Filed: Jan. 10, 1995

[30] Foreign Application Priority Data

Jan. 12, 1994 [EP] European Pat. Off. .............. 94830005

[51] Int. Cl.⁶ ........................................ H05K 7/20
[52] U.S. Cl. ........................................ 361/720; 174/252
[58] Field of Search .................... 165/80.2, 80.3, 165/185; 174/16.3, 252; 257/706–707, 712–713; 361/688, 690, 704–713, 719–721

[56] References Cited

U.S. PATENT DOCUMENTS

| 3,165,672 | 1/1965 | Gellert ........................... | 361/706 |
| 5,220,487 | 6/1993 | Patel et al. ..................... | 361/712 |

FOREIGN PATENT DOCUMENTS

| 0291400 | 11/1988 | European Pat. Off. ............. | 361/720 |
| 3829117A1 | 3/1990 | Germany . | |
| 4232575 | 3/1994 | Germany ........................... | 174/252 |
| 273465 | 9/1991 | Japan ................................ | 361/720 |
| 4051597 | 2/1992 | Japan ................................ | 361/719 |
| 1217148 | 12/1970 | United Kingdom . | |

OTHER PUBLICATIONS

"Heat Transfer Improvement for Thermal Carrier Circuit Cards" IBM Technical Disclosure Bulletin, p. 498, 1992.

*Primary Examiner*—Gregory D. Thompson
*Attorney, Agent, or Firm*—McGlew and Tuttle

[57] ABSTRACT

A laminar board for printed circuits is described, consisting of a base layer (1) made of a material with a high coefficient of thermal conduction and, on at least one side (1B) of the base layer, a coating (13) of electrically insulating material forming the surface for the application of the conducting tracks (11) of the printed circuit. The base layer (1) has at least one deformed area with a depression (3A) on one side (1A) and a corresponding projection (3B) on the opposite side (1B), the insulating coating (13) being applied to the side (1B) on which the projection (3B) is disposed, forming a surface substantially free of discontinuities, with a lesser thickness at the position of the projection (3B) and a greater thickness in the areas adjacent to the projection; the power components (15) of the circuit are fitted over the projection (3B).

15 Claims, 2 Drawing Sheets

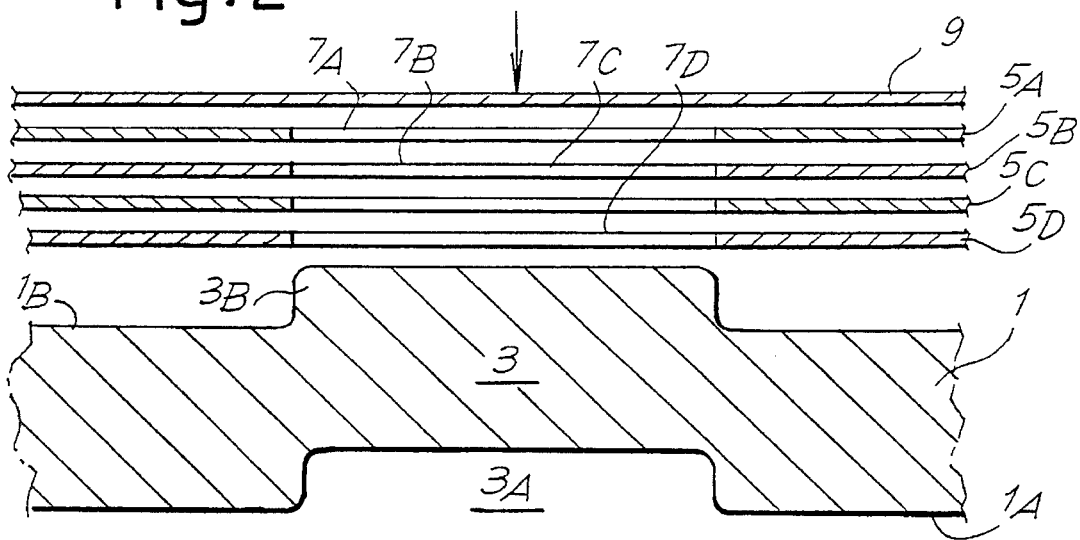
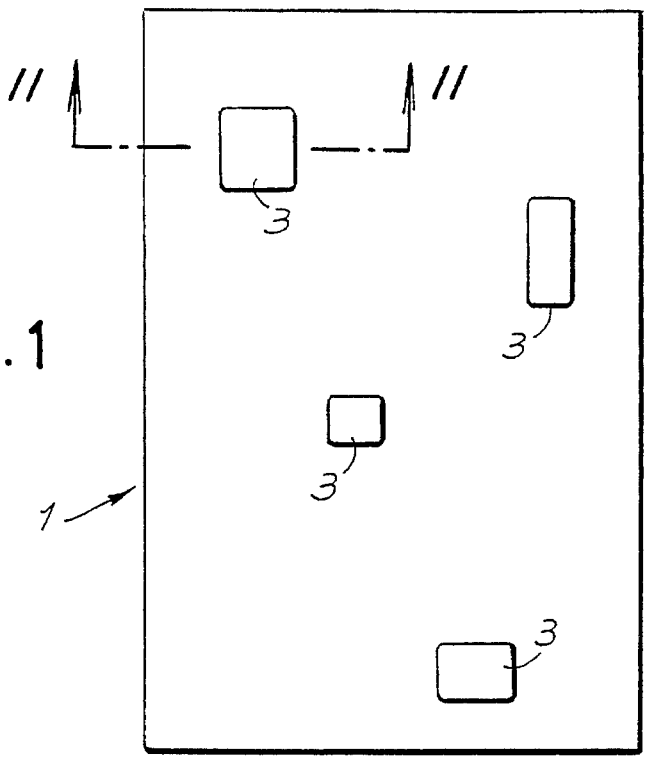
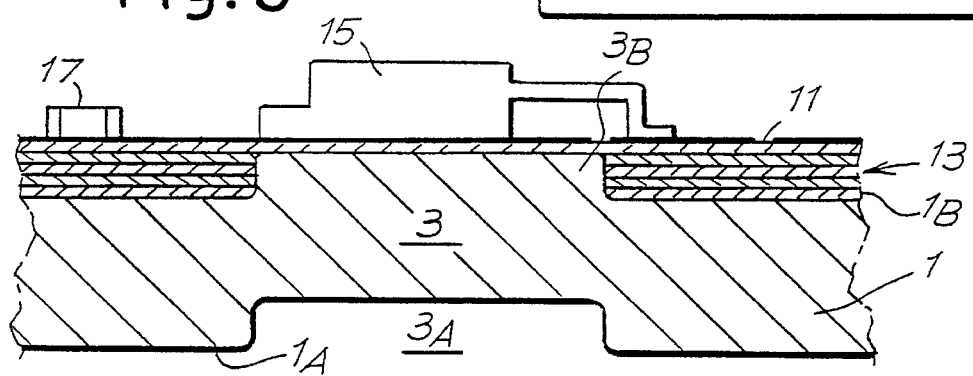

LAMINAR BOARD FOR THE PRODUCTION OF PRINTED CIRCUITS, PRINTED CIRCUIT MADE WITH THE SAID BOARD, AND METHOD FOR ITS FABRICATION

BACKGROUND OF THE INVENTION

The invention relates to a laminar board for printed circuits, comprising a base layer made of a material with a high coefficient of thermal conduction, in particular a metallic material, and (on at least one side of the base layer) a coating of electrically insulating material forming the surface for the application of the conducting tracks of the printed circuit.

FIELD OF THE INVENTION

Laminar boards divided basically into two categories are currently used to make printed circuits. The first category contains the boards made with a base layer of insulating material coated on one, or possibly both, sides, with a metallic, particularly copper, layer. The copper layer is then chemically etched to form the conducting tracks of the printed circuits. This type of board is also made in a multiple-layer version. The second category of laminar boards contains those boards which have a base layer of metallic material with a high coefficient of thermal conduction, on which is applied, on at least one side, an electrically insulating layer to which the conducting tracks of the printed circuit are applied, these tracks also being formed by chemical etching of a foil of copper or other electrically conducting material.

Laminar boards of the first type are most commonly used, but have the disadvantage of not easily permitting dissipation of the heat generated by the power components of the electronic circuits. Consequently, they require the use of heat sink elements associated with the individual power components to ensure sufficient dissipation and to prevent overheating phenomena. This entails high material and labour costs of assembly. Moreover, circuits fitted with heat sinks have particular large dimensions and require a considerable space for installation.

To meet the requirements of heat dissipation without the aid of external heat sinks, laminar boards of the second type are used in certain cases. These permit more simple dissipation of the heat generated by the power components, owing to the metallic base layer. The thermal power generated by the power components is transferred (through a thin electrically insulating coating with a high coefficient of thermal conduction) to the underlying metallic base layer and from this to the external environment. Consequently there is an increase in the temperature of the whole base layer, and hence of areas beneath the logic components, which thus undergo considerable undesirable heating owing to the high coefficient of thermal conduction of the insulating layer which separates the tracks from the metallic base.

Within the present description and claims, reference will frequently be made to power components and to logic components. These terms are intended to designate, respectively, components which dissipate large amounts of thermal power (usually characterized by relatively wide temperature ranges for operation), and components which do not dissipate significant amounts of thermal power and which normally have relatively restricted maximum operating temperature limits. The definitions provided above should not, however, be understood in a restrictive sense.

The components known as logic components are normally highly sensitive to temperature and are characterized by thermal operating limits lower than those specified for the power components. When these logic components operate at temperatures close to the specified maximum temperature, the component may be damaged or more likely age more quickly, causing a drastic reduction in MTBF (Mean Time Between Failures).

SUMMARY AND OBJECTS OF THE INVENTION

The present invention proposes a new board for printed circuits, a printed circuit made with the board, and a method of producing printed circuits, which overcome the disadvantages of conventional boards and circuits.

More particularly, the object of the present invention is to provide a board for printed circuits which enables heat generated by the power components to be efficiently dissipated, and also enables the logic components of the electronic circuit to be protected from excessive temperature rises.

Substantially, in the laminar board according to the invention, the base layer has at least one deformed area, with a depression on one side and a corresponding projection on the opposite side. An insulating coating is applied to the side on which the projection is disposed, and forms a surface substantially free of discontinuities, with a lesser thickness at the position of the projection formed in the base layer and a greater thickness in the surrounding area. In this way the electrically insulating coating provides a substantially smooth and flat surface on which a copper foil can be applied to form the conducting tracks, but between the free surface of the insulating coating, to which the copper foil forming the track is applied, and the metallic body forming the base layer there is a thermal barrier of variable thickness, and in particular of greater thickness at the locations where the logic components are disposed and of lesser thickness next to the power components. This enables the heat generated by the power components to be dissipated efficiently through a thin layer of thermally insulating material, while the logic components are protected from the high temperature which the base layer may reach, by a layer of insulating material of greater thickness.

Further characteristic advantages of the board according to the invention are indicated in the attached dependent claims. In particular, the insulating material forming the coating may be a polymer resin or preferably a vetronite structure of the type commonly used in this field. In the latter case, the coating may advantageously consist of a multiple-layer structure with a multiplicity of superimposed layers, each of which has an aperture at the position of each projection of the base layer. In contrast, the final layer of insulating material is a continuous layer and is the one that forms the single insulating barrier at the position of the projection formed in the base layer.

The board according to the invention may also be used to form multiple layer circuits, that is circuits with a plurality of electrically interconnected levels of tracks.

The invention also relates to a printed circuit made with the use of a board of the type mentioned above.

According to the known art, printed circuits known as single or double sided are made on a laminar base product of a standard type. This laminar product consists of a board of vetronite, or equivalent insulating material, with a sheet of copper on one or both of the sides on which the conducting tracks are subsequently created for the fitting of the circuit components. According to the invention, however, the board is not a standard laminar material for all circuits, but has a structure which varies from circuit to circuit, since it must have depressions and projections at the future positions of the power components in the circuit. The invention therefore proposes a completely innovative method for the production of the printed circuit, which requires preliminary shaping of the base layer before the application of the insulating layer and of the subsequent conducting foil in which the conducting tracks of the printed circuit will then be formed.

Substantially, the method according to the invention is characterized by the following stages:

identification of the area(s) where the power components are to be fitted;

deformation of the base layer in these areas by generating a projection on a first surface of the said base layer in each of the said area or areas and a corresponding depression on the opposite surface;

application of the insulating coating to the said first surface, forming an external surface substantially free of discontinuities, the said insulating coating having a lesser thickness at the positions of the said projection or projections and a greater thickness in the adjacent areas;

application of a foil of electrically conducting material on the insulating layer;

forming of the conducting tracks of the printed circuit in the foil of electrically conducting material; and fitting of the power component or components at the positions of the said projection or projections formed in the base layer.

Further advantageous embodiments of the method according to the invention are indicated in the attached dependent claims.

The invention will be more clearly understood from the description and the attached drawing which shows a non-restrictive practical example of the invention. In the drawing,

BRIEF DESCRIPTION OF THE PREFERRED EMBODIMENTS

FIG. 1 is a schematic plan view of a possible embodiment of the base layer of the board according to the invention;

FIG. 2 shows, of a local section through II—II in FIG. 1, the application of the layer of insulating material;

FIG. 3 shows a section similar to FIG. 2, after the formation of the insulating layer and the fitting of two components, namely one logic and one power component.

DETAILED DESCRIPTION OF THE PREFERRED EMBODIMENT

Figure 4:
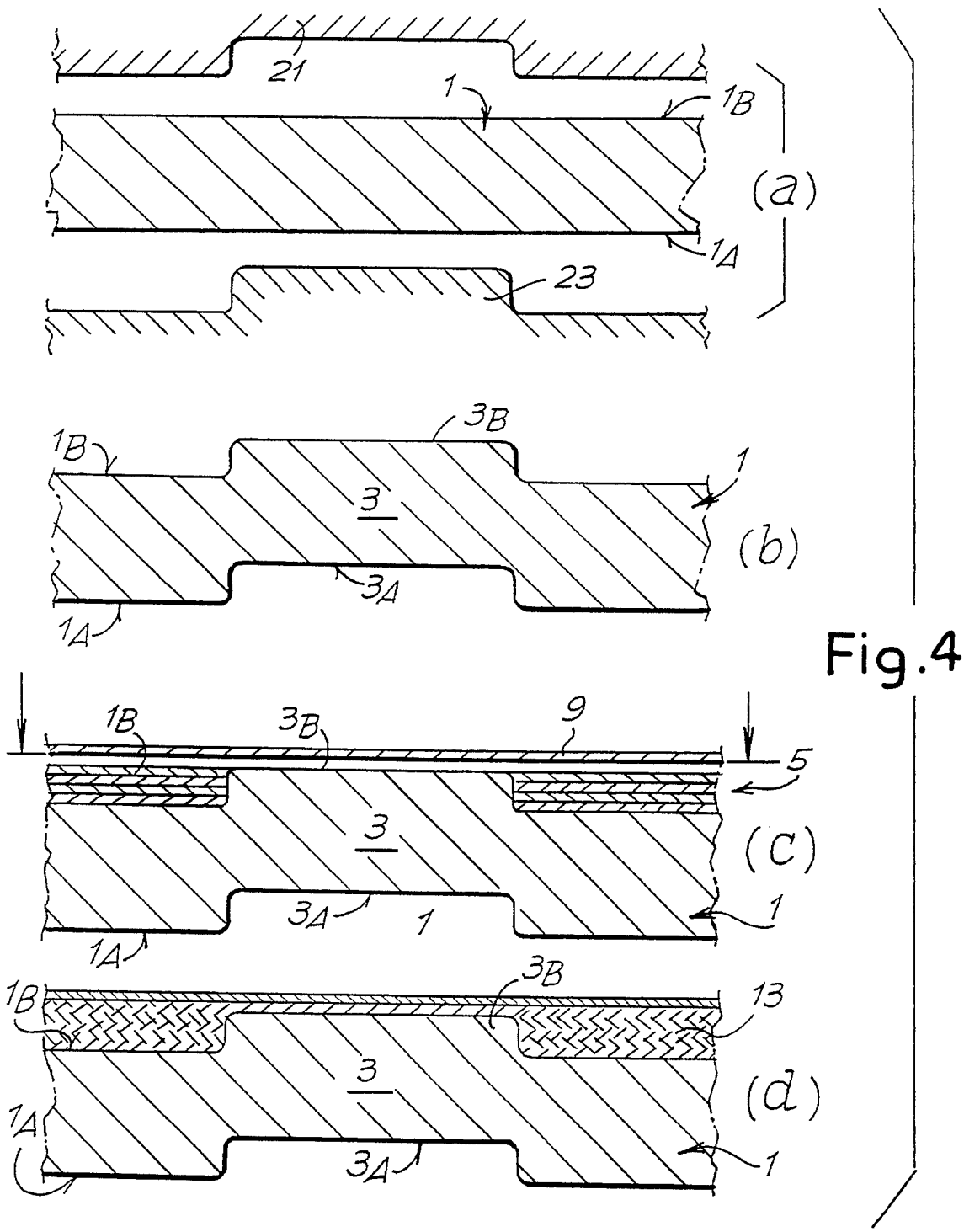
FIGS. 4A–4D shows, in a very schematic way, the subsequent stages of the process of producing a printed circuit according to the invention in a possible embodiment.

FIG. 1 is a plan view of the base layer, indicated in a general way by 1, of the board according to the invention. The base layer is cut to form a rectangular sheet of suitable dimensions, and deformed areas, indicated in a general way by 3, are provided in the base layer. In the example illustrated, there are four substantially rectangular deformed areas having different dimensions and shapes for reasons which will be made clear subsequently. The projections may be of any shape, depending on the shape of the components with which they are to be associated. However, the most commonly used shape is rectangular, as illustrated.

As may be seen in particular in the local section in FIG. 2, each deformed area 3 consists of a depression 3A on the lower side 1A of the base layer 1 and a projection 3B on the upper side 1B of the said base layer 1.

A coating of insulating material which may, for example, include a stratified structure of vetronite sheets, is formed on the base layer 1. FIG. 2 shows schematically a method of forming this insulating coating. As shown in FIG. 2, four foils of insulating material (for example vetronite), indicated by 5A–5D, are disposed on the base layer 1. Each foil 5A–5D has an aperture indicated by 7A–7D respectively, at the position of each projection 3B. The size of each aperture 7A–7D substantially corresponds to that of the respective projection 3B. An outer foil 9 free of apertures is disposed over the foil 5A. The total thickness of the foils 5A–5D is substantially equal to the thickness of the projection 3B.

The thicknesses of the foils 5A–5D and the foil 9 may vary, for example from 10 to 200 μm.

A foil of electrically conducting metallic material, for example a copper foil, with a thickness that may, for instance, be equal to 35–100 μm, is disposed over the insulating coating formed by the superimposition of foils 5A–5D and 9. The structure obtained in this way is pressed to stabilize the various layers and is used as the printed circuit board. The circuit is obtained by forming tracks by chemical etching with substantially conventional techniques.

FIG. 3 shows a section similar to FIG. 2 with the printed circuit formed on the board. The number 11 indicates the section of the tracks of conducting material formed on the free surface of the insulating coating, indicated as a whole by 13, and formed by the superimposition of foils 5A–5D and 9. The circuit components are fitted on the surface on which the conducting tracks 11 are formed. In the schematic example in FIG. 3 a power component 15, disposed over the deformed area 3 of the base layer 1, is indicated. The number 17 indicates a logic component over a non-deformed area of the base layer 1.

As shown in the diagram in FIG. 3, the power component 15, which during operation emits a considerable quantity of heat, is separated from the base layer of metallic material 1 by a thin electrically insulating layer, whose thickness corresponds substantially to the thickness of the laminar foil 9. This provides very good heat transfer from the power component 15 to the underlying metallic base layer 1 with a high coefficient of thermal conduction. Conversely, the logic component 17 is separated from the underlying base layer 1 by a layer of insulating material of much greater thickness, equal, in the particular embodiment illustrated here, to five times the thickness of insulating material disposed between the power components 15 and the base layer 1. This ensures that the logic component 17 is efficiently thermally insulated from the base layer 1, which may reach quite high temperatures. The logic component 17 therefore operates in thermal conditions better than those found in conventional systems with a metallic base layer, since the heat dissipated by the power component 15 does not substantially affect the temperature of the logic component 17.

FIGS. 4A–4D show schematically four successive stages of production of the laminar support, and more particularly FIG. 4A shows the base layer 1 before the deformation which may be done by means of a punch and die, indicated by 21 and 23 respectively. FIG. 4B shows the base layer 1 after deformation, with the deformed area 3, while FIG. 4C shows an intermediate stage in the formation of the insulating coating by superimposition of the foils 5A–5D, 9. FIG. 4D shows the complete board with the foil of copper or other highly conducting metal, from which the tracks 11 of the printed circuit are subsequently formed. The board in FIG. 4D is made by compression of the multiple-layer structure 5, 9 on which the copper foil for the formation of the printed circuit tracks has been superimposed.

As an alternative to the process schematically indicated above, it is possible to form the insulating 13 with a polymeric body. This polymeric body is spread on the upper surface 1B of the base layer 1, on which the projections 3B are made, or with a single sheet of suitably shaped insulating material.

The process described above is also applicable to the formation of multiple-layer circuits, in other words circuits in which the metallic electrically connecting tracks are made on a number of levels.

It is to be understood that the drawing shows only an example provided solely as a practical demonstration of the invention, and that this invention may be varied in its forms and dispositions without departure from the scope of the guiding concept of the invention. The presence of any reference numbers in the enclosed claims has the purpose of facilitating the reading of the claims with reference to the description and to the drawing, and does not limit the scope of protection represented by the claims.

I claim:

1. A printed circuit board comprising:
   a base layer having a first side and a second side, said base layer including a projection extending from said first side, said base layer and said projection being formed of thermally conductive material;
   a plurality of first insulating layers positioned adjacent each other on said first side of said base layer, each of said plurality of first insulating layers defining an aperture similar in size and location to said projection to cause said projection to extend through said aperture of said each first insulating layer;
   a second insulating layer positioned on said plurality of first insulating layers opposite said base layer, said second insulating layer covering said plurality of first insulating layers and said projection, said plurality of first insulating layers and said second insulating layer forming an insulating coating on said base layer, said insulating coating having a thickness adjacent said projection which is less than a thickness spaced from said projection;
   conductive tracks on a side of said second insulating layer opposite said first insulating layers.

2. A printed circuit board in accordance with claim 1, wherein:
   said projection is of a substantially rectangular shape.

3. A printed circuit board in accordance with claim 1, wherein:
   said base layer is a metallic layer.

4. A printed circuit board in accordance with claim 1, wherein:
   said insulating coating includes insulating material formed of a polymeric body.

5. A printed circuit board in accordance with claim 1, wherein:
   said insulating coating includes insulating material formed of fiberglass reinforced epoxy resin.

6. A printed circuit board in accordance with claim 1, wherein:
   a large heat generating component is positioned on said second insulating layer and adjacent said projection;
   a low operating temperature component is positioned on said second insulating layer at a position spaced from said projection.

7. A printed circuit board in accordance with claim 1, wherein:
   a power component is positioned on said second insulating layer and adjacent said projection;
   a logic component is positioned on said second insulating layer at a position having a thickness greater than a thickness adjacent said projection.

8. A printed circuit board in accordance with claim 1, wherein:
   said plurality of first insulating layers are thermally insulating;
   said second insulating layer is electrically insulating.

9. A printed circuit board in accordance with claim 8, wherein:
   said second insulating layer is thermally conductive.

10. A printed circuit board in accordance with claim 9, wherein:
    said second insulating layer has a high coefficient of thermal conduction.

11. A printed circuit board in accordance with claim 1, wherein:
    said second insulating layer forms a continuous uniform surface substantially free of discontinuities;
    said plurality of first insulating layers form a thickness substantially equal to a height of said projection.

12. A printed circuit board in accordance with claim 1, wherein:
    said plurality of first insulating layers are positioned immediately adjacent each other and contain no conductive tracks between said first insulating layers.

13. A printed circuit board in accordance with claim 1, wherein:
    said base layer defines a depression opposite said projection on said second side.

14. A method of forming a printed circuit board, the method comprising the steps of:
    providing a base layer;
    identifying an area on said base layer where a power component will be positioned;
    deforming a first side of said base layer in said position of said power component to cause a projection on a second side of said base layer;
    providing a plurality of first insulating layers, each of said plurality of first insulating layers defining an aperture similar in size and location to said projection;
    applying said plurality of first insulating layers to said second side of said base layer to cause said projection to extend through said apertures of said each insulating layer;
    providing a second insulating layer, said second insulating layer being continuous;
    applying said second insulating layer on to said plurality of first insulating layers to cover said plurality of first insulating layers and said projection;
    pressing said plurality of first insulating layers and said second insulating layer to form an insulating coating having a thickness adjacent said projection which is less than a thickness spaced from said projection;

applying a foil of electrically conducting material onto said insulating coating;

forming conductive tracks from said foil of electrically conducting material;

attaching said power component onto said insulating coating at a position adjacent said projection.

15. A method of forming a printed circuit board, the method comprising the steps of:

providing a base layer with first and second sides;

forming a projection in said base layer extending from said first side;

forming a plurality of first insulating layers with each of said plurality of first insulating layers being formed with an aperture similar in size and location to said projection;

applying said plurality of first insulating layers to said first side of said base layer to cause said projection to extend through said aperture of said each first insulating layer;

applying a second insulating layer over said plurality of first insulating layers and said projection;

compressing said base layer, said plurality of insulating layers and said second insulating layer to stabilize said layers and to cover said plurality of first insulating layers and said projection with said second insulating layer in a continuous uniform surface substantially free of discontinuities.

* * * * *